(12) United States Patent
Ito et al.

(10) Patent No.: US 10,150,231 B2
(45) Date of Patent: Dec. 11, 2018

(54) METHOD FOR MANUFACTURING PHOTO CURED MATERIAL

(71) Applicant: CANON KABUSHIKI KAISHA, Tokyo (JP)

(72) Inventors: Toshiki Ito, Kawasaki (JP); Akiko Iimura, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 633 days.

(21) Appl. No.: 14/391,069

(22) PCT Filed: Apr. 23, 2013

(86) PCT No.: PCT/JP2013/062684
§ 371 (c)(1),
(2) Date: Oct. 7, 2014

(87) PCT Pub. No.: WO2013/162049
PCT Pub. Date: Oct. 31, 2013

(65) Prior Publication Data
US 2015/0075855 A1    Mar. 19, 2015

(30) Foreign Application Priority Data

Apr. 27, 2012 (JP) ................................. 2012-102342

(51) Int. Cl.
*B29C 35/08* (2006.01)
*G03F 7/00* (2006.01)
(Continued)

(52) U.S. Cl.
CPC ........ *B29C 35/0805* (2013.01); *B29C 59/022* (2013.01); *C08F 112/08* (2013.01);
(Continued)

(58) Field of Classification Search
CPC . B29C 35/0805; B29C 59/022; C08F 112/08; G03F 7/0002; H01L 21/0273; H05K 1/181; H05K 3/0082; H05K 3/064
See application file for complete search history.

(56) References Cited

U.S. PATENT DOCUMENTS

| 7,670,529 B2 | 3/2010 | Choi et al. |
| 7,670,530 B2 | 3/2010 | Choi et al. |

(Continued)

FOREIGN PATENT DOCUMENTS

| CN | 101019066 A | 8/2007 |
| EP | 0 977 085 A1 | 2/2000 |

(Continued)

OTHER PUBLICATIONS

Qing Wang et al., "Effects of Environmental Gas in UV Nanoimprint on the Characteristics of UV-Curable Resin," 49 Jpn. J. Appl. Phys. 06G104, pp. 1-4 (Jun. 2010) (XP055253673).

(Continued)

*Primary Examiner* — Edmund H Lee
*Assistant Examiner* — Jamel M Nelson
(74) *Attorney, Agent, or Firm* — Fitzpatrick, Cella, Harper & Scinto

(57) ABSTRACT

Provided is a method for manufacturing a photo cured material, by which transferring precision can be improved and a small surface roughness can be obtained. The method includes the steps of: placing a photo-curable composition on a substrate; brining a mold into contact with the photo-curable composition; irradiating the photo-curable composition with light; and releasing the mold from the photo-curable composition. The contact is performed in a condensable gas atmosphere, the condensable gas condensing under a temperature condition at the contact and under a pressure condition that the condensable gas receives when (Continued)

the photo-curable composition intrudes gaps between the substrate and the mold or concavities provided on the mold, and the photo-curable composition includes a gas dissolution inhibitor having a rate of weight change with reference to the condensable gas that is −1.0% to 3.0%.

11 Claims, 2 Drawing Sheets

(51) Int. Cl.
    *H01L 21/027*     (2006.01)
    *B29C 59/02*     (2006.01)
    *C08F 112/08*     (2006.01)
    *H05K 1/18*     (2006.01)
    *H05K 3/00*     (2006.01)
    *H05K 3/06*     (2006.01)
    *B29K 25/00*     (2006.01)
    *B29K 105/00*     (2006.01)

(52) U.S. Cl.
    CPC ........ *G03F 7/0002* (2013.01); *H01L 21/0273* (2013.01); *H05K 1/181* (2013.01); *H05K 3/0082* (2013.01); *H05K 3/064* (2013.01); *B29C 2035/0827* (2013.01); *B29K 2025/06* (2013.01); *B29K 2025/08* (2013.01); *B29K 2105/0002* (2013.01); *B29K 2105/0085* (2013.01); *B29K 2995/0027* (2013.01)

(56) References Cited

U.S. PATENT DOCUMENTS

| | | | |
|---|---|---|---|
| 7,856,288 B2 | 12/2010 | Yoneda et al. | |
| 8,019,462 B2 | 9/2011 | Yoneda et al. | |
| 8,109,753 B2 | 2/2012 | Choi et al. | |
| 8,109,754 B2 | 2/2012 | Choi et al. | |
| 8,647,554 B2 | 2/2014 | Jones et al. | |
| 2005/0270312 A1 | 12/2005 | Lad et al. | |
| 2007/0228593 A1 | 10/2007 | Jones et al. | |
| 2009/0267268 A1 | 10/2009 | Yoneda et al. | |
| 2010/0004155 A1 | 1/2010 | Ishihara et al. | |
| 2012/0175822 A1* | 7/2012 | Inamiya | B29C 59/022 264/479 |
| 2012/0225263 A1 | 9/2012 | Kodama | |

FOREIGN PATENT DOCUMENTS

| | | | |
|---|---|---|---|
| JP | 2001174990 A | * | 6/2001 |
| JP | 2004-103817 A | | 4/2004 |
| JP | 2004103817 A | * | 4/2004 |
| JP | 3700001 B2 | | 9/2005 |
| JP | 2008-502157 A | | 1/2008 |
| JP | 2009-088376 A | | 4/2009 |
| JP | 2010-106062 A | | 5/2010 |
| JP | 2010106062 A | * | 5/2010 |
| JP | 2011-124554 A | | 6/2011 |
| WO | 2005/120834 A2 | | 12/2005 |
| WO | 2011/059104 A1 | | 5/2011 |

OTHER PUBLICATIONS

Extended European Search Report in European Application No. 13 78 2399.3 (dated Mar. 8, 2016).
Notice of Preliminary Rejection in Korean Application No. 10-2014-7032394 (dated Feb. 26, 2016).
Office Action in Taiwanese Application No. 102114841 (dated Dec. 1, 2014).
Notice of Ground of Rejection in Japanese Application No. 2012-102342 (dated Nov. 10, 2015).
Reibai Pocketbook: Pocketbook for Coolants (Asahi Glass Co., Ltd.), pp. 79-81 (no date listed).
First Office Action in Chinese Application No. 201380021750.0 (dated Feb. 2, 2016).

* cited by examiner

FIG. 1A
FIG. 1B
FIG. 1CA
FIG. 1CB
FIG. 1D
FIG. 1E
FIG. 1F
FIG. 1G
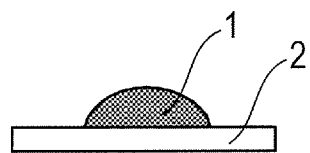
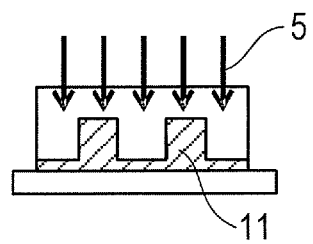
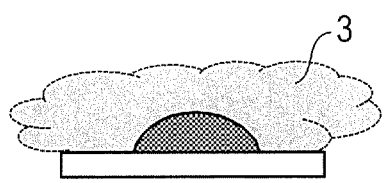
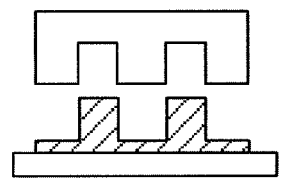
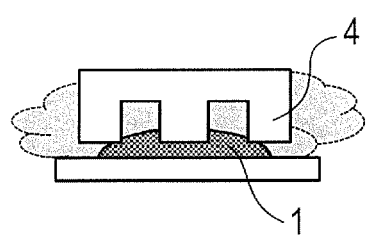
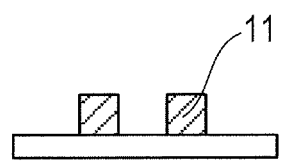
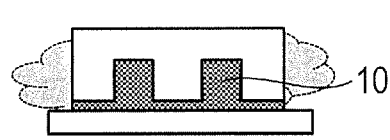
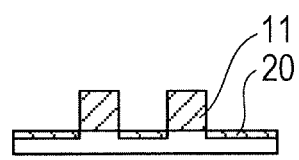

METHOD FOR MANUFACTURING PHOTO CURED MATERIAL

TECHNICAL FIELD

The present invention relates to a method for manufacturing a photo cured material, particularly a photo cured material having a predetermined patterned shape.

BACKGROUND ART

A photo nanoimprint is available as a technique to process a resin material in a nanometer scale or to fabricate a resin film having a nano-scale pattern.

The photo nanoimprint technique uses a mold, on a surface of which a minute convexo-concave pattern is formed, to make a resin material/resin film having a patterned shape following this minute convexo-concave pattern. More specifically, the photo nanoimprint technique is to form/process a resin film where the mold is pressed against a substrate with resist (photo-curable composition) applied thereon and the resist is irradiated with light via the mold for curing, whereby the convexo-concave pattern of the mold is transferred to the resist film on the substrate.

One of the problems to be solved in the photo nanoimprint techniques is how to transfer the convexo-concave pattern of the mold to the resist film precisely. IF the mold is brought into contact with the resist in the atmosphere when transferring the pattern to the resist film, the air existing in a gap between a base member and the mold or concavities on the mold may be trapped by intrusion of the photo-curable composition to make up the resist film. Thus, air bubbles may remain between the resist film and the mold even after the mold and the resist film comes into contact with, which causes a failure to transfer the convexo-concave pattern of the mold to the resist film precisely.

To solve such a problem, Patent Literature 1 proposes a method of performing the step of bringing a mold into contact with a resist film in the atmosphere of condensable gas that condenses under the conditions of a pressure and a temperature where a photo-curable composition making up the resist film intrudes gaps between a base member and the mold or concavities on the mold.

CITATION LIST

Patent Literature

PTL 1: Japanese Patent No. 3700001

Non Patent Literature

NPL 1: Reibai pocketbook (Pocketbook for Coolants) (Asahi Glass Co., Ltd.), page 81

SUMMARY OF INVENTION

Technical Problem

Although the method proposed by PTL 1 enables precise transfer to a resist film, it generates another problem of nano-scale surface roughness on the resulting photo cured film.

In view of the above problems and issues, it is an object of the present invention to provide a method for manufacturing a photo cured material having a predetermined patterned shape by a photo nanoimprint technique, in which transferring precision is improved and a photo cured material of smaller surface roughness is provided.

Solution to Problem

A method for manufacturing a photo cured material having a predetermined patterned shape, comprising the steps of: placing a photo-curable composition on the substrate; brining a mold into contact with the photo-curable composition; irradiating the photo-curable composition with light; and releasing the mold from the photo-curable composition, wherein the contact is performed in a condensable gas atmosphere, the condensable gas condenses under a temperature condition at the contact and under a pressure condition that the condensable gas receives when the photo-curable composition intrudes gaps between the substrate and the mold or concavities provided on the mold, and the photo-curable composition includes a gas dissolution inhibitor having a rate of weight change with reference to the condensable gas that is −1.0% to 3.0%.

Advantageous Effects of Invention

The present invention can provide a manufacturing method, by which transferring precision can be improved and a photo cured material of small surface roughness can be obtained.

Further features of the present invention will become apparent from the following description of exemplary embodiments with reference to the attached drawings.

BRIEF DESCRIPTION OF DRAWINGS

FIGS. 1A, 1B, 1CA, 1CB, 1D, 1E, 1F and 1G are schematic cross-sectional views showing manufacturing process of a photo cured material and a substrate with circuit according to the manufacturing method of the present invention.

DESCRIPTION OF EMBODIMENTS

Figure 2A:
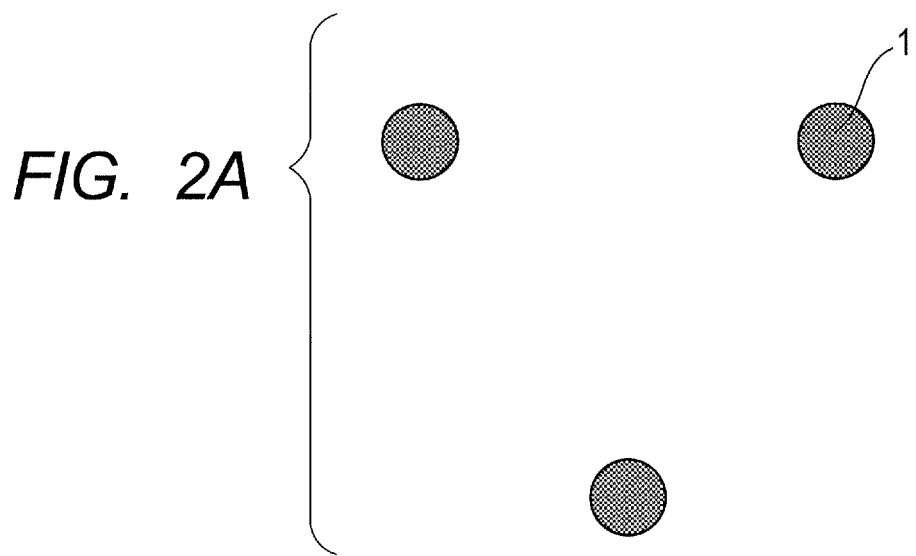
FIGS. 2A and 2B are plan views showing the state of a photo-curable composition placed at a plurality of positions so as to be away from each other.

The following describes embodiments of the present invention in detail. The present invention is not limited to the following embodiments, and of course the present invention includes variations and modifications performed appropriately to the following embodiments within the range of not deviating from the gist of the present invention and based on common knowledge of those skilled in the art.

A method of manufacturing a photo cured material of the present invention is to manufacture a photo cured material having a predetermined patterned shape on a substrate, which at least includes the following (1) to (4) steps:

(1) placing a photo-curable composition on a substrate;
(2) bringing a mold into contact with the photo-curable composition;
(3) irradiating the photo-curable composition with light; and
(4) releasing the mold from the photo-curable composition.

In the present invention, the above contact step (2) is performed in the atmosphere of condensable gas. In the present invention, the condensable gas used in the contact step (step (2)) condenses under the conditions of a temperature shown in (2-1) and a pressure shown in (2-2):

(2-1) a temperature condition at the contact step; and (2-2) a pressure condition given to the condensable gas when the photo-curable composition intrudes gaps between a substrate and the mold or concavities on the mold.

In the present invention, the photo-curable composition used at step (1) includes a gas dissolution inhibitor having a rate of weight change with reference to the condensable gas that is −1.0% to 3.0%.

Although the method of manufacturing a photo cured material of the present invention may include a manufacturing process using a photo imprinting, the method used for the present invention is not limited to the photo imprinting. In the case of using the photo imprinting in the present invention, a photo cured material having a convexo-concave pattern of a milli-level, a micron-level (including submicron level) or a nano-level (1 nm to 100 nm) can be manufactured. Among them, a pattern of 1 nm to 10 mm in size is preferably formed by the photo imprinting. More preferably, a pattern of 10 nm to 100 μm is formed.

Referring to the drawings, the specific manufacturing process according to the manufacturing method of the present invention is described below. FIGS. 1A to 1G are schematic cross-sectional views showing the manufacturing process of a photo cured material and a substrate with a circuit according to the manufacturing method of the present invention. The manufacturing process shown in FIGS. 1A to 1G includes the following steps (A) to (F) or (G):

(A) placing step (FIG. 1A);
(B) condensable gas supplying step (FIG. 1B);
(C) contact step (imprinting step, FIG. 1CA, FIG. 1CB);
(D) photo-irradiation step (FIG. 1D);
(E) release step (FIG. 1E);
(F) etching step (residual film removable step, FIG. 1F); and
(G) substrate processing step (FIG. 1G).

Through the above steps (A) to (G) (or steps (A) to (F)), a photo cured material 11 can be obtained from a photo-curable composition 1, and an electronic component (electronic device) or an optical component including the photo cured material 11 can be obtained. The following describes each step in detail.

(A) Placing Step (FIG. 1A)

To begin with, the photo-curable composition 1 is placed on a substrate 2 (FIG. 1A). This step may also be called an application step because the photo-curable composition 1 is in a liquid form.

The substrate 2 used in this step may be selected suitably for the usage of the photo cured material 11 to be manufactured by the method of the present invention. More specifically, for the usage of the photo cured material 11 as a mask to process a substrate, the substrate 2 of FIG. 1A may be a substrate for semiconductor devices, for example. An example of the substrate for semiconductor devices includes a substrate made of silicon wafer. Instead of the substrate made of silicon wafer, a substrate made of aluminum, titanium-tungsten alloy, aluminum-silicon alloy, aluminum-copper-silicon alloy, silicon oxide, silicon nitride or the like may be used. The substrate made of the above-stated material used for semiconductor devices may undergo a surface treatment such as a silane coupling treatment, a silazane treatment or film-formation of a film made of an organic material for improved adherence with the photo-curable composition 1.

If a transparent member is used for the photo cured material 11, the photo cured material 11 can be an optical member. In such a case, the substrate 2 may be a substrate having light permeability, more specifically, a transparent substrate such as a glass substrate.

As shown in FIG. 1A, the photo-curable composition 1 is placed (applied) on the substrate 2, specifically by ink jet method, dip coating, air-knife coating, curtain coating, wire bar coating, gravure coating, extrusion coating, spin coating or a slit scan method.

The photo-curable composition 1 may be placed on the substrate 2 in the following manner, but not limited to, of (A-1) and (A-2), for example:

(A-1) the photo-curable composition 1 is placed at a plurality of positions so as to be away from each other; and (A-2) the photo-curable composition 1 is placed on the entire face of the substrate 2.

When the manner (A-1) is selected, the photo-curable composition 1 to be placed (applied) on the substrate 2 may be a droplet of, but not limited to, a micron-level size or submicron-level size.

When the manner (A-2) is selected, the photo-curable composition 1 to be placed (applied) on the substrate 2 may have a film thickness of 0.001 μm to 100.0 μm, for example, which may be selected by usages.

The photo-curable composition used at this step includes a polymerizable monomer (first component), a polymerization initiator (second component) and a gas dissolution inhibitor (third component). This photo-curable composition may additionally include an additive component to be described below.

<First Component: Polymerizable Monomer>

The polymerizable monomer included in the photo-curable composition functions as a photo curable component. Examples of the polymerizable monomer include a radical polymerizable monomer.

The radical polymerizable monomer preferably is a compound having at least one acryloyl group or methacryloyl group, e.g. (meta)acrylic compound.

The polymerizable monomer as the first component may include one type alone or a combination of two or more types of monomers.

<Second Component: Polymerization Initiator>

The polymerization initiator included in the photo-curable composition is a compound that functions as a curing aid to assist the curing of the photo-curable component (polymerizable monomer). When the polymerizable monomer as the first component is a radical polymerizable monomer, the polymerization initiator used is a compound that generates radicals in response to light (infrared ray, visual ray, ultraviolet ray, far-ultraviolet ray, X-ray, charged particle radiation such as electron ray, or radial ray).

The polymerization initiator as the second component may include one type alone or a combination of two or more types of initiators.

In the present invention, the relative combination ratio of the second component (polymerization initiator) to the first component (polymerizable monomer) is 0.01 weight % or more and 10 weight % or less with reference to the total amount of the first component. Preferably, the relative combination ratio is 0.1 weight % or more and 7 weight % or less. The relative combination ratio of the second component less than 0.01 weight % reduces the curing speed, thus reducing reaction efficiency of the first component. On the other hand, the relative combination ratio exceeding 10 weight % may lead to degraded mechanical properties of the obtained photo cured material.

<Third Component: Gas Dissolution Inhibitor>

The gas dissolution inhibitor is a component included in the photo-curable composition to prevent the photo-curable composition 1 or the photo cured material 11 from being penetrated or dissolved by the condensable gas used at the condensable gas supplying step (step (B)) described later.

In the present invention, the gas dissolution inhibitor is a component that, when being exposed to the atmosphere of the condensable gas, does not swell while including the gas or that is not dissolved by the condensable gas. More specifically, the gas dissolution inhibitor is a component having a rate of weight change with reference to the condensable gas that is −1.0% to 3.0%.

The gas dissolution inhibitor may be selected suitably for the condensable gas to be used. For instance, when pentafluoropropane (PFP) is used as the condensable gas, the gas dissolution inhibitor used may be a polymer compound such as polyvinyl chloride, polyethylene, polypropylene, polystyrene, polycarbonate, polyacetal, polyphenylene oxide, phenol resin, ABS resin, nylon 66, PTFE resin or epoxy resin, a low-molecular compound such as vinyl chloride derivative, ethylene derivative, propylene derivative or styrene derivative or oligomers obtained by polymerization of these low-molecular compounds, for example (see NPL 1).

Among these compounds, styrene derivative, including polystyrene, is preferably used. In the case of using styrene derivative as the gas dissolution inhibitor, it may be a monomer, polystyrene obtained by polymerization of one type styrene, or a copolymer obtained by copolymerization of styrene with other compounds (monomers). As the styrene derivative used as the gas dissolution inhibitor, polystyrene or a styrene copolymer is preferably used.

Specific examples of the monomer compounds as the styrene derivative include styrene, methylstyrene, dimethylstyrene, trimethylstyrene, ethylstyrene, isopropylstyrene, butylstyrene, methoxystyrene, butoxystyrene, acetoxystyrene, chlorostyrene, dichlorostyrene, bromostyrene, chloromethyl styrene, methyl vinylbenzoate and α-methylstyrene.

The gas dissolution inhibitor as the third component may include one type alone or a combination of two or more types of inhibitors.

In the present invention, the relative combination ratio of the third component (gas dissolution inhibitor) to the first component (polymerizable monomer) is 0.01 weight % or more and 99.9 weight % or less with reference to the total amount of the first component. Preferably, the relative combination ratio is 0.1 weight % or more and 50 weight % or less. The relative combination ratio of the third component less than 0.01 weight % makes it difficult to suppress the surface roughness that is one of the advantageous effects of the present invention. On the other hand, the relative combination ratio exceeding 99.9 weight % may lead to degraded mechanical properties of the photo cured material obtained.

Being exposed to 1,1,1,3,3-pentafluoropropane ($CHF_2CH_2CF_3$, HFC-245fa) as condensable gas, polystyrene has a lower rate of weight change, a lower a rate of dimension change and a lower dissolution rate due to the exposure than those of acrylic resin (NPL 1). Although the detailed causal association with properties of polystyrene is unclear, this presumably relates to reduction of surface roughness that is one of the advantageous effects of the present invention.

<Other Components>

The photo-curable composition used at this step includes the first component (polymerizable monomer), the second component (polymerization initiator) and the third component (styrene derivative) as stated above. The photo-curable composition may include additive components such as antioxidant, solvent and polymer components suitable for various purposes so as not to degrade the effects of the present invention.

<Temperature During Preparation of Photo-Curable Composition>

The photo-curable composition may be prepared within the temperature range from 0° C. to 100° C. without problems.

<Viscosity of Photo-Curable Composition>

The photo-curable composition of the present invention preferably has viscosity from 1 cP to 100 cP under the condition at 23° C., the viscosity showing the value of the mixture of components other than the solvent. The viscosity more preferably is 5 cP to 50 cP and particularly preferably it is 6 cP to 20 cP. The viscosity of the photo-curable composition exceeding 100 cP requires long time to fill the concavities of the minute pattern on the mold with the photo-curable composition during the contact step (imprinting step) described later or leads to pattern defects due to a failure of filling. The viscosity lower than 1 cP may lead to unevenness of the composition applied (placed) or the composition flowing out from the end of the mold at the contact step described later.

<Surface Tension of Photo-Curable Composition>

The photo-curable composition of the present invention preferably has surface tension from 5 mN/m to 70 mN/m under the condition at 23° C., the surface tension showing the value of the mixture of components other than the solvent. The surface tension more preferably is from 7 mN/m to 35 mN/m and particularly preferably it is from 10 mN/m to 32 mN/m. The surface tension lower than 5 mN/m requires long time to fill the concavities and convexities at the mold surface with the photo-curable composition during the contact step (imprinting step) described later. On the other hand, the surface tension exceeding 70 mN/m degrades the surface smoothness.

<Removal of Foreign Matters Such as Particles>

After mixing the above-stated components, the photo-curable composition 1 is preferably filtered with a filter of 0.001 μm to 5.0 μm in pore size, for example, to remove foreign matters such as particles. Such particles in the composition may be a factor of a defect of inhibiting the formation of concavities and convexities to be formed at the photo cured material. Filtering of the photo-curable composition may be performed at a plurality of stages. Preferably it is repeated a plurality of times. Liquid subjected to filtering may be filtered again. The filter used for filtering of the photo-curable composition may be made of, but not limited to, polyethylene resin, polypropylene resin, fluorine resin, nylon resin or the like.

For the usage of the photo cured material manufactured by the manufacturing method of the present invention to manufacture a semiconductor integrated circuit, the photo-curable composition before curing may be preferably filtered, for example, by which procedure the possibility of contamination by metal impurities can be minimized and the operation of the product is not impeded. To this end, the concentration of the metal impurities to be allowed in the photo-curable composition is preferably 10 ppm or less and more preferably 100 ppb or less.

(B) Condensable Gas Supplying Step (FIG. 1B)

Then, condensable gas 3 is supplied to the substrate 2 until the surroundings of the photo-curable composition 1 placed on the substrate 2 become the atmosphere of condensable gas (FIG. 1B).

The condensable gas in the present invention refers to gas having a property of typically existing as gas under the temperature condition and the pressure condition in the manufacturing apparatus of a photo cured material having a desired pattern but condensing (liquefying) under a predetermined condition at the contact step (imprinting step) described later. The predetermined condition will be described later in detail.

The condensable gas has the vapor pressure of 0.05 MPa or more and 1.00 MPa or less at a room temperature (25° C.), has the boiling point of 15° C. or more and 30° C. or lower under atmospheric pressure (1.00 MPa), or satisfies the above requirements for vapor pressure and boiling point.

Specific examples of the condensable gas include fluorocarbons such as chlorofluorocarbon (CFC), fluorocarbon (FC), hydrochlorofluorocarbon (HCFC), hydrofluorocarbon (HFC) and hydrofluoroether (HFE).

Among these fluorocarbons, 1,1,1,3,3-pentafluoropropane ($CHF_2CH_2CF_3$, HFC-245fa), trichlorofluoromethane and methylpentafluoroethyl ether ($CF_3CF_2OCH_3$, HFE-245mc) are particularly preferable. For information, 1,1,1,3,3-pentafluoropropane has the vapor pressure of 0.14 MPa at a room temperature (23° C.) and the boiling point of 15° C. Trichlorofluoromethane has the vapor pressure of 0.1056 MPa at a room temperature (23° C.) and the boiling point of 24° C.

One type of such condensable gas may be used alone or a combination of two or more types of gases may be used. Such condensable gas may be used in a mixture state with non-condensable gas such as air, nitrogen, carbon dioxide, helium or argon.

At this step (condensable gas supplying step), a predetermined amount of the condensable gas 3 in a gas state is supplied to the surroundings of the photo-curable composition 1 provided on the substrate 2 under the conditions of pressure lower than the vapor pressure or temperature higher than the boiling point.

(C) Contact Step (FIG. 1CA, FIG. 1CB)

Then, a mold 4 is brought into contact with the photo-curable composition 1 (FIG. 1CA, FIG. 1CB). This step is called imprinting step as well. Since the surroundings of the photo-curable composition 1 are set under the atmosphere of the condensable gas 3 in the preceding step (condensable gas supplying step), this step (contact step) is performed under the atmosphere of the condensable gas 3.

As shown in FIG. 1CA, coming into contact of the mold 4 with the photo-curable composition 1, capillary force acts so as to let the photo-curable composition 1 intrude gaps between the substrate 2 and the mold 4 or concavities (minute pattern) on the mold 4. At this time, the condensable gas 3 existing in the gaps between the substrate 2 and the mold 4 or concavities on the mold 4 condenses for liquefaction under the pressure condition received from the photo-curable composition 1 and the temperature condition at this step. Then, the volume of the condensable gas 3 existing in the gaps between the substrate 2 and the mold 4 or concavities on the mold 4 can be approximated to zero, and thus there are no bubbles remaining in a minute pattern 10 made of the photo-curable composition. Thus, the pattern transferring precision can be improved.

Figure 2B:
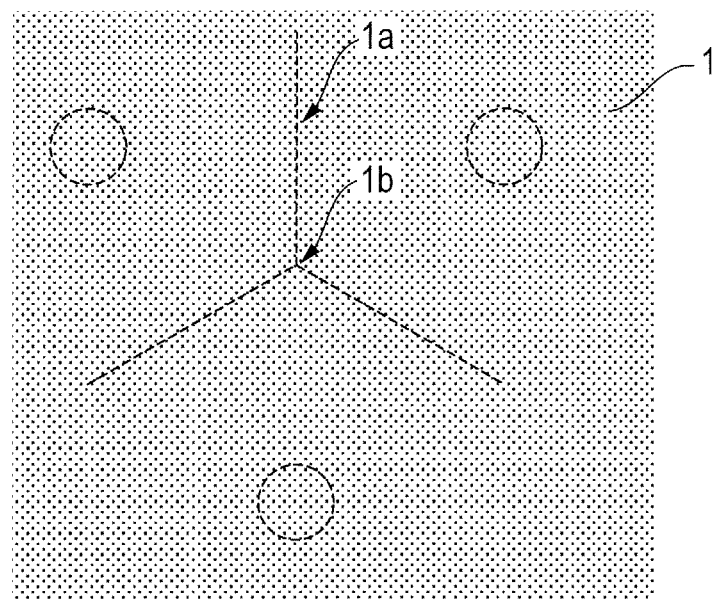

FIGS. 2A and 2B are plan views showing the state of a photo-curable composition placed at a plurality of positions so as to be away from each other. FIG. 2A shows the state of the photo-curable composition at the placing step, and FIG. 2B shows the state of the photo-curable composition at the contact step.

As shown in FIG. 2A, droplets of the photo-curable composition 1 are placed at three positions of the substrate so as to be away from each other, which is then brought into contact with a mold (not illustrated). Then, each droplet of the photo-curable composition 1 expands its diameter while being made thinner due to capillary force at gaps between the substrate and the mold. At this time, the condensable gas existing at the position 1a where two expanded droplets meet and at the position 1b where three expanded droplets meet receive pressure from the droplets of the photo-curable composition 1 to condense for liquefaction. Consequently, there are less bubbles remaining at the position 1a and the position 1b. In this way, the photo cured material having a desired pattern with less defects due to residual bubbles can be obtained.

The mold 4 used at this step is made of a light-transmissive material, specifically including glass, quartz, PMMA, a transparent resin such as a polycarbonate resin, a transparent metal evaporated film, a flexible film such as polydimethylsiloxane, a light curing film, a metal film or the like.

The mold used may undergo a surface treatment to improve releasability between the photo-curable composition and the mold surface. Exemplary methods for the surface treatment include a method using silane coupling agent such as silicone agent or fluorine agent or using mold release agent coating. Commercially available mold release agent coating may be used as well preferably, including OPTOOL DSX produced by Daikin industries, Ltd.

Specifically, the mold release agent coating may be used prior to the present step (contact step, imprinting step) to form a layer of the mold release agent coating on the surface of the mold 4 on the side having a convexo-concave pattern. Examples of the mold release agent include silicone release agent, fluorine release agent, polyethylene release agent, polypropylene release agent, paraffin release agent, montan release agent and carnauba release agent. Among them, fluorine release agent is particularly preferable. The release agent may include one type alone or a combination of two or more types of agents.

Pressure from the mold 4 coming into contact with the photo-curable composition 1 is typically 0.1 Pa to 100 MPa, although not particularly limited. The pressure from 0.1 Pa to 50 MPa is preferable, 0.1 Pa to 30 MPa is more preferable and 0.1 Pa to 20 MPa is particularly preferable. Duration for contact is not particularly limited, and it is typically 0.1 second to 600 seconds. The duration from 0.1 second to 300 seconds is preferable, 0.1 second to 180 seconds is more preferable and 0.5 second to 120 seconds is particularly preferable. The duration shorter than 0.1 second does not make the photo-curable composition 1 sufficiently intrude the gaps between the substrate 2 and the mold 4 and concavities (minute pattern) on the mold 4. The duration longer than 600 seconds degrades the productivity.

(D) Photo-Irradiation Step (FIG. 1D)

Then, a photo-curable composition 10 having a desired pattern shape in contact with the mold 4 is irradiated with light (FIG. 1D). Thereby, the photo-curable composition 10 having a patterned shape following the convexo-concave pattern formed on the surface of the mold 4 is cured to become the photo cured material 11.

The light applied to the photo-curable composition 10 at this step is not particularly limited, which may be selected suitably for the sensitive wavelength of the photo-curable composition used. Preferably, ultraviolet ray of about 150 nm to 400 nm in wavelength, X ray or electron ray can appropriately selected for use. Among them, ultraviolet ray is particularly preferable because a wide variety of photo-sensitive compounds having sensitivity to ultraviolet ray, as the polymerization initiator (second component) included in the photo-curable composition 10, are easily available.

Exemplary light source that emits ultraviolet ray includes a high-pressure mercury lamp, an ultrahigh pressure mercury lamp, a low-pressure mercury lamp, a Deep-UV lamp, a carbon arc lamp, a chemical lamp, a metal halide lamp, a xenon lamp, a KrF excimer laser, an ArF excimer laser, or an $F_2$ excimer laser. Among them, an ultrahigh pressure mercury lamp is particularly preferable. These light sources may include one type alone or a combination of two or more types of sources for use. At this step, the photo irradiation may be performed to the entire region of the photo-curable composition 10 or selectively performed to a part of the region of the photo-curable composition 10.

In the case of a photo-curable composition 10 having a thermosetting property, heat may be additionally applied for curing. The atmosphere and the temperature for heating are not particularly limited, and for instance, heat may be applied at 40° C. to 200° C. under an inert atmosphere or under reduced pressure. Heat may be applied using a hot plate, an oven, a furnace or the like.

(E) Release Step (FIG. 1E)

Then, the mold and the photo-curable composition are released (FIG. 1E). Thereby, the photo cured material 11 having a reversed pattern of the convexo-concave pattern formed on the surface of the mold 4 can be obtained.

A method and a condition for releasing the mold and the photo-curable composition in the present invention are not particularly limited. For instance, they may be released by moving the mold 4 in the direction away from the substrate 2 while fixing the substrate 2, by moving the substrate 2 in the direction away from the mold 4 while fixing the mold 4 or by pulling both of them in the opposite directions.

When this step is completed, the photo cured material 11 having a reversed pattern of the convexo-concave pattern of the surface of the mold 4 is formed on at least part on the substrate 2. Intervals of the convexo-concave pattern of the photo cured material 11 reflect the intervals of the convexo-concave pattern provided on the surface of the mold 4. Any interval of the convexo-concave pattern provided on the surface of the mold 4 can be set, specifically including milli-scale, micro-scale (including submicron-scale) and nano-scale, among which any scale can be selected appropriately for setting. When the convexo-concave pattern of nano-scale is formed by the manufacturing method of the present invention, for example, a pattern with intervals of 20 nm or less can be formed.

In the case of the mold 4 having an area smaller than that of the substrate 2, a part of the photo-curable composition 1 provided on the substrate 2 will not come into contact with the mold 4. In such a case, the mold 4 used may be moved appropriately to perform a series of process including the aforementioned placing step, contact step, photo-irradiation step and release step at a plurality of regions on the substrate. Thereby, a plurality of photo cured materials 11 each having the patterned shape following the convexo-concave shape of the mold 4 can be obtained on the substrate 2.

(F) Etching Step (Residual Film Removable Step, FIG. 1F)

After the releasing step, the photo cured material 11 is formed, but a thin-film form cured matter exists in the concavities as well. To remove the photo cured material 11 existing in the concavities, etching is performed thereto (FIG. 1F). This step makes the surface of the substrate 2 exposed at regions corresponding to the concavities of the photo cured material 11.

A specific method of the etching performed at this step is not particularly limited, and a conventionally well-known method such as dry etching is performed. The dry etching may be performed using a conventionally well-known dry etching apparatus. Source gas supplied during the dry etching may be selected suitably for the elemental composition of the photo cured material 11 to be etched, and gas including oxygen atoms such as $O_2$, CO or $CO_2$, inert gas such as He, $N_2$ or Ar, chlorine gas such as $Cl_2$ or $BCl_3$ or other gas such as $H_2$ or $NH_3$ may be used. These gases may include a combination of two types or more for use.

Through the manufacturing process including the above (A) to (F), the photo cured material 11 having a desired convexo-concave pattern shape (patterned shape following the convexo-concave shape of the mold 4) can be obtained. When the substrate 2 is to be processed using the thus formed photo cured material 11, then the below-described substrate processing step may be additionally performed.

On the other hand, the thus obtained photo cured material 11 may be used as an optical device (including the case of one element of an optical device). In such a case, it may be provided as an optical component at least including the substrate 2 and the photo cured material 11 placed on the substrate 2.

(G) Substrate Processing Step (FIG. 1G)

The photo cured material 11 having a desired convexo-concave patterned shape obtained by the manufacturing method of the present invention can be used as an interlayer insulating layer in an electronic component including semiconductor devices such as a LSI, a system LSI, a DRAM, a SDRAM, a RDRAM and a D-RDRAM. Alternatively, this photo cured material 11 can be used as a resist film to manufacture semiconductor devices.

For the usage of the photo cured material 11 as the resist film, as shown in FIG. 1G, etching or ion implantation is performed at parts exposed by the etching step. Thereby, a circuit 20 can be formed on the substrate 2, following the patterned shape of the photo cured material 11. In this way, a circuit board used for semiconductor devices and the like can be manufactured. Electronic elements may be disposed appropriately on the substrate 2 provided with the circuit 20 shown in FIG. 1G, whereby an electronic component (electronic device) can be obtained.

The pattern of the photo cured material 11 may be removed finally from the processed substrate 2, or in a preferable configuration, the photo cured material may be left as a component making up an electronic element.

EXAMPLES

The following describes the present invention in more detail by way of examples. The technical scope of the present invention is not limited to the following examples. "Parts" and "%" referred to in the following description are all based on weight unless otherwise specified.

Reference Example 1

Firstly, mixed liquid of 4 parts by weight of polystyrene having a molar weight of 96,400 and molecular-weight dispersivity of 1.01 (produced by Polymer Source) and 96 parts by weight of propylene glycol monomethylether acetate (PGMEA, produced by Tokyo Chemical Industry CO., Ltd.) was prepared. Next, the thus prepared mixture liquid was filtered with a 0.2-μm filter made of tetrafluoroethylene, thus obtaining coating liquid.

Then, drops of this coating liquid were put on a silicon substrate, followed by spin coating at the number of revolutions of 500 rpm for 5 seconds and then of 3,000 rpm for 30 seconds, thus forming a thin film. Then, the thus formed thin film was heated on a hot plate at 90° C. for 90 seconds, whereby the silicon substrate with a polystyrene film formed thereon was obtained.

A value of surface roughness Peak to Valley (PV) of the thus obtained polystyrene film was measured using an atomic force microscope: Nanoscope produced by Veeco Instruments Inc. (measurement range: 2 μm×2 μm). The measured value was 8 nm.

Then, this substrate formed with the polystyrene film was immersed for 120 minutes into 1,1,1,3,3-pentafluoropropane that was cooled to 14° C. for condensation. The value of surface roughness PV of the polystyrene film after immersion was similarly measured, and the value measured was 8 nm, which was substantially the same as that before the immersion.

Comparative Example 1

Drops of commercially-available photo-curable composition PAK-01-60 (produced by Toyo Gosei Co. Ltd.) were put on a silicon substrate, followed by spin coating at the number of revolutions of 1,000 rpm for 30 seconds, thus forming a thin film. Then, the substrate was heated on a hot plate at 80° C. for 120 seconds. Next, the PAK-01-60 film was irradiated with light emitted from an ultrahigh pressure mercury lamp under a nitrogen atmosphere, whereby a photo cured film was obtained. Illuminance from the light source on the film was 25 mW/cm$^2$ at the wavelength of 365 nm, and the photo-irradiation duration was 40 seconds.

A value of surface roughness PV of the thus obtained photo cured film was measured similarly to Reference Example 1, and the value measured was 4 nm.

Then, this substrate formed with the PAK-01-60 photo cured film was immersed for 120 minutes into 1,1,1,3,3-pentafluoropropane that was cooled to 14° C. for condensation. The value of surface roughness PV of the PAK-01-60 photo cured film after immersion was measured similarly to Reference 1, and the value measured was 30 nm, showing that the surface became rougher than before the immersion.

Example 1

Commercially-available photo-curable composition PAK-01-60 (produced by Toyo Gosei Co. Ltd.), polystyrene and solvent are mixed, thus obtaining a photo-curable composition. Following the manufacturing processing shown in FIGS. 1A to 1G, the photo-curable composition 1 is applied on the substrate 2 and the photo-curable composition 1 is irradiated with light via the mold 4, whereby a photo cured material having a patterned shape following the convexo-concave pattern on the surface of the mold 4 is obtained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-102342, filed Apr. 27, 2012, which is hereby incorporated by reference herein in its entirety.

REFERENCE SIGNS LIST

1(10) photo-curable composition
2 substrate
3 condensable gas
4 mold
5 light
11 photo cured material

The invention claimed is:

1. A method for manufacturing a photo cured material having a predetermined patterned shape, the method comprising the steps of:
    placing a photo-curable composition on a substrate;
    bringing a mold into contact with the photo-curable composition;
    irradiating the photo-curable composition with light; and
    releasing the mold from the photo-curable composition,
    wherein the contact is performed in an atmosphere of a condensable gas,
    wherein the condensable gas condenses under a temperature condition at the contact and under a pressure condition that the condensable gas receives when the photo-curable composition intrudes into a plurality of gaps between the substrate and the mold or concavities provided on the mold,
    wherein the photo-curable composition comprises a polymerizable monomer and a gas dissolution inhibitor against the condensable gas,
    wherein the gas dissolution inhibitor has a rate of weight change with reference to the condensable gas that is −1.0% to 3.0%, where the rate of weight change with reference to the condensable gas is (weight after being exposed to the condensable gas)/(weight before being exposed to the condensable gas) (%) −100,
    wherein the gas dissolution inhibitor comprises at least one of an oligomer and a polymer, and
    wherein the condensable gas has a vapor pressure of 0.05 MPa to 1.00 MPa at room temperature and has a boiling point of 15° C. to 30° C. under atmospheric pressure.

2. The method according to claim 1, wherein at the placing, the photo-curable composition is placed at a plurality of positions to be away from each other.

3. The method according to claim 1, wherein at the placing, the photo-curable composition is placed at an entire face of the substrate.

4. The method according to claim 1, wherein the gas dissolution inhibitor includes a styrene derivative.

5. The method according to claim 4, wherein the styrene derivative includes a styrene copolymer.

6. The method according to claim 4, wherein the styrene derivative includes a polystyrene.

7. The method according to claim 1, wherein the condensable gas includes fluorocarbons.

8. The method according to claim 7, wherein the fluorocarbons include at least one of 1,1,1,3,3-pentafluoropropane, trichlorofluoromethane and methylpentafluoroethyl ether.

9. The method according to claim 1, wherein the mold lets light used at the irradiating pass therethrough.

10. The method according to claim 1, wherein the photo cured material has pattern intervals of 20 nm or less.

11. The method according to claim 1, wherein:
    the mold has an area smaller than an area of the substrate,
    the placing, the bringing into contact, the irradiating, and the releasing are performed at a plurality of regions on the substrate using the mold, and
    a plurality of photo cured materials each having a patterned shape following a convexo-concave shape of the mold are disposed on the substrate.

* * * * *